United States Patent
Nagahisa et al.

(10) Patent No.: US 9,437,726 B2
(45) Date of Patent: Sep. 6, 2016

(54) FIELD EFFECT TRANSISTOR

(71) Applicant: SHARP KABUSHIKI KAISHA, Osaka-shi, Osaka (JP)

(72) Inventors: Tetsuzo Nagahisa, Osaka (JP); Shinichi Handa, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/787,443

(22) PCT Filed: May 16, 2014

(86) PCT No.: PCT/JP2014/063101
§ 371 (c)(1),
(2) Date: Oct. 27, 2015

(87) PCT Pub. No.: WO2015/008532
PCT Pub. Date: Jan. 22, 2015

(65) Prior Publication Data
US 2016/0118488 A1 Apr. 28, 2016

(30) Foreign Application Priority Data
Jul. 19, 2013 (JP) ................................. 2013-150544

(51) Int. Cl.
*H01L 29/15* (2006.01)
*H01L 29/778* (2006.01)
*H01L 29/207* (2006.01)
(Continued)

(52) U.S. Cl.
CPC ....... *H01L 29/7787* (2013.01); *H01L 29/1029* (2013.01); *H01L 29/205* (2013.01); *H01L 29/207* (2013.01); *H01L 29/7786* (2013.01); *H01L 29/1079* (2013.01);
(Continued)

(58) Field of Classification Search
CPC ............... H01L 29/205; H01L 29/207; H01L 29/1029; H01L 29/2003; H01L 29/7786; H01L 29/7787; H01L 29/518; H01L 29/1079; H01L 29/41766
USPC .................................... 257/24, 57, 58, 66, 76
See application file for complete search history.

(56) References Cited

U.S. PATENT DOCUMENTS 7,884,393 B2 * 2/2011 Hashimoto ....... H01L 21/02389
257/192
8,569,800 B2 * 10/2013 Ikeda .................. H01L 29/0847
257/200
(Continued)

FOREIGN PATENT DOCUMENTS

| JP | 2010-245504 A | 10/2010 |
| JP | 2013-021106 A | 1/2013 |
| JP | 2013-080776 A | 5/2013 |

*Primary Examiner* — Hung Vu
(74) *Attorney, Agent, or Firm* — Birch, Stewart, Kolasch & Birch, LLP

(57) ABSTRACT

In a field effect transistor, a carbon concentration in a buffer layer at the side closer to a high resistance layer is not less than $0.8 \times 10^{19}/cm^3$ and not more than $1.0 \times 10^{21}/cm^3$, a carbon concentration in the high resistance layer at the side closer to the buffer layer is not less than $3.7 \times 10^{18}/cm^3$ and not more than $1.0 \times 10^{21}/cm^3$, and a carbon concentration in the high resistance layer at the side closer to the channel layer is not less than $1.4 \times 10^{19}/cm^3$ and not more than $1.0 \times 10^{21}/cm^3$.

4 Claims, 11 Drawing Sheets

(51) Int. Cl.
  *H01L 29/205* (2006.01)
  *H01L 29/51* (2006.01)
  *H01L 29/10* (2006.01)
  *H01L 29/20* (2006.01)
  *H01L 29/417* (2006.01)

(52) U.S. Cl.
  CPC .... *H01L 29/2003* (2013.01); *H01L 29/41766* (2013.01); *H01L 29/518* (2013.01)

(56) References Cited

U.S. PATENT DOCUMENTS

2011/0241088 A1* 10/2011 Sato .................... H01L 29/0847
  257/288
2011/0298009 A1* 12/2011 Ikuta ................. H01L 21/02381
  257/190
2013/0082355 A1  4/2013 Abe et al.

* cited by examiner

FIELD EFFECT TRANSISTOR

TECHNICAL FIELD

The present invention relates to a field effect transistor.

BACKGROUND ART

Because a nitride semiconductor is featured in having a high breakdown voltage and high carrier mobility, utilization of the nitride semiconductor as a power device, etc. is expected.

A field effect transistor used in a power device, etc. and made of a nitride semiconductor is demanded to have high reliability particularly in an off-state where a high voltage is applied, namely to have a long lifetime.

One example of related-art field effect transistors has a structure in which a substrate withstand voltage is improved with control of a carbon concentration in a GaN substrate, as disclosed in Japanese Unexamined Patent Application Publication No. 2010-245504 (PTL 1).

CITATION LIST

Patent Literature

PTL 1: Japanese Unexamined Patent Application Publication No. 2010-245504

SUMMARY OF INVENTION

Technical Problem

Regarding the related-art field effect transistor mentioned above, however, PTL 1 does not include any discussions about an improvement of lifetime in the actual transistor operation.

In other words, the related-art field effect transistor mentioned above has the problem that there is still a room for the improvement of lifetime and reliability is not increased sufficiently.

Accordingly, an object of the present invention is to provide a field effect transistor having sufficiently high reliability.

Solution to Problem

To achieve the above object, the present invention provides a field effect transistor comprising:
a substrate;
a buffer layer laminated on the substrate;
a high resistance layer laminated on the buffer layer;
a channel layer laminated on the high resistance layer;
a nitride semiconductor layer laminated on the channel layer and serving as a barrier layer;
a source electrode and a drain electrode disposed on the nitride semiconductor layer at positions spaced from each other; and
a gate electrode formed between the source electrode and the drain electrode and on the nitride semiconductor layer, the gate electrode being connected to the nitride semiconductor layer directly or with an insulating film interposed therebetween,
wherein a carbon concentration in the buffer layer at side closer to the high resistance layer is not less than $0.8 \times 10^{19}/cm^3$ and not more than $1.0 \times 10^{21}/cm^3$,
a carbon concentration in the high resistance layer at side closer to the buffer layer is not less than $3.7 \times 10^{18}/cm^3$ and not more than $1.0 \times 10^{21}/cm^3$, and
a carbon concentration in the high resistance layer at side closer to the channel layer is not less than $1.4 \times 10^{19}/cm^3$ and not more than $1.0 \times 10^{21}/cm^3$.

Here, the nitride semiconductor layer may be expressed by $Al_xIn_yGa_{1-x-y}N$ ($x \geq 0$, $y \geq 0$, and $0 \leq x+y \leq 1$).

The carbon concentration in the buffer layer at the side closer to the high resistance layer means the carbon concentration in a part of the buffer layer at the side closer to the high resistance layer than a midpoint of the buffer layer in a direction of layer thickness.

The carbon concentration in the high resistance layer at the side closer to the buffer layer means the carbon concentration in a part of the high resistance layer at the side closer to the buffer layer than a midpoint of the high resistance layer in a direction of layer thickness.

The carbon concentration in the high resistance layer at the side closer to the channel layer means the carbon concentration in a part of the high resistance layer at the side closer to the channel layer than the midpoint of the high resistance layer in the direction of layer thickness.

In the field effect transistor according to an embodiment,
the carbon concentration in the buffer layer at the side closer to the high resistance layer is not less than $1.2 \times 10^{19}/cm^3$,
the carbon concentration in the high resistance layer at the side closer to the buffer layer is not less than $4.4 \times 10^{18}/cm^3$, and
the carbon concentration in the high resistance layer at the side closer to the channel layer is not less than $1.6 \times 10^{19}/cm^3$.

In the field effect transistor according to an embodiment,
the carbon concentration in the buffer layer at the side closer to the high resistance layer is not less than $1.6 \times 10^{19}/cm^3$,
the carbon concentration in the high resistance layer at the side closer to the buffer layer is not less than $5.4 \times 10^{18}/cm^3$, and
the carbon concentration in the high resistance layer at the side closer to the channel layer is not less than $1.9 \times 10^{19}/cm^3$.

In the field effect transistor according to an embodiment,
the carbon concentration in the high resistance layer gradually increases toward the channel layer from the side close to the buffer layer.

Advantageous Effects of Invention

The field effect transistor of the present invention includes a substrate, a buffer layer laminated on the substrate, a high resistance layer laminated on the buffer layer, a channel layer laminated on the high resistance layer, and a nitride semiconductor layer laminated on the channel layer and serving as a barrier layer. A carbon concentration in the buffer layer at the side closer to the high resistance layer is not less than $0.8 \times 10^{19}/cm^3$ and not more than $1.0 \times 10^{21}/cm^3$. A carbon concentration in the high resistance layer at the side closer to the buffer layer is not less than $3.7 \times 10^{18}/cm^3$ and not more than $1.0 \times 10^{21}/cm^3$. A carbon concentration in the high resistance layer at the side closer to the channel layer is not less than $1.4 \times 10^{19}/cm^3$ and not more than $1.0 \times 10^{21}/cm^3$. As a result, a lifetime can be prolonged drastically. Hence reliability can be increased sufficiently.

DESCRIPTION OF EMBODIMENT

A field effect transistor of the present invention will be described in detail below in connection with an illustrated embodiment.

Figure 1:
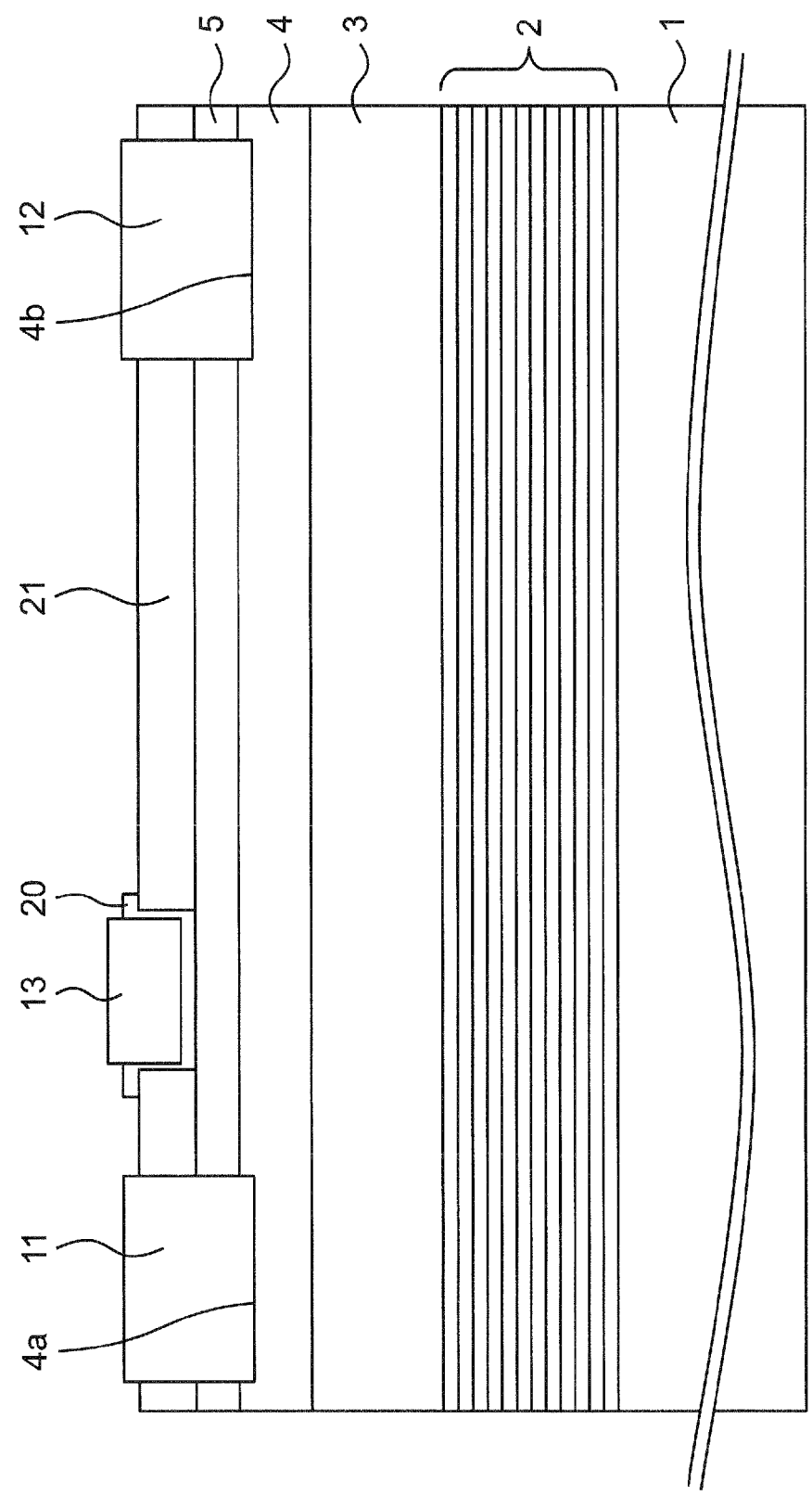
FIG. 1 is a schematic sectional view of a field effect transistor according to one embodiment of the present invention.

FIG. 1 is a schematic sectional view of a field effect transistor according to one embodiment of the present invention, the view being taken along a plane perpendicular to a direction of layer thickness of the transistor.

The field effect transistor of the present invention includes a substrate 1 that is a silicon substrate, a buffer layer 2 laminated on the substrate 1, a high resistance layer 3 laminated on the buffer layer 2, a channel layer 4 laminated on the high resistance layer 3, a barrier layer 5 laminated on the channel layer 4, a source electrode 11 and a drain electrode 12 that are disposed on the barrier layer 5 at positions spaced from each other, and a gate electrode 13 that is formed between the source electrode 11 and the drain electrode 12 and on the barrier layer 5. A first insulating film 20 is formed between the barrier layer 5 and the gate electrode 13. Furthermore, a second insulating film 21 covers an almost entire region of an upper surface of the barrier layer 5 where the barrier layer 5 is not covered with the source electrode 11 and the drain electrode 12. The barrier layer 5 is one example of a nitride semiconductor layer.

The buffer layer 2 is constituted by plural films of AlN and plural films of $Al_xGa_{1-x}N$ ($0 \leq x < 1$). More specifically, the buffer layer 2 has a superlattice structure in which AlN and $Al_xGa_{1-x}N$ are alternately laminated. An Al composition x of $Al_xGa_{1-x}N$ is constant in a depth direction. A total layer thickness of the plural films of AlN and the plural films of $Al_xGa_{1-x}N$, i.e., a layer thickness of the buffer layer 2, is 2.3 μm. A main purpose of the buffer layer 2 is to ensure a withstand voltage across a region from the barrier layer 5 to the substrate 1.

The buffer layer 2 is formed such that a carbon concentration in the buffer layer 2 at the side closer to the high resistance layer 3 is not less than $0.8 \times 10^{19}/cm^3$, desirably not less than $1.6 \times 10^{19}/cm^3$, and not more than $1.0 \times 10^{21}/cm^3$. If the carbon concentration in the buffer layer 2 at the side closer to the high resistance layer 3 is more than $1.0 \times 10^{21}/cm^3$, crystallinity would deteriorate, and a side effect, e.g., a decrease of the withstand voltage or an increase of a leak, would start to occur.

The high resistance layer 3 is a GaN layer having a high carbon concentration and having a layer thickness of 840 nm. A main purpose of the high resistance layer 3 is to reduce a leak between the source and the drain via a portion that is positioned under the channel layer 4. For that purpose, electric resistance of the high resistance layer 3 is set to be higher than that of the channel layer 4.

In the high resistance layer 3, a carbon concentration is not less than $3.7 \times 10^{18}/cm^3$, desirably not less than $5.4 \times 10^{18}/cm^3$, and not more than $1.0 \times 10^{21}/cm^3$ over an entire region in the depth direction thereof.

Furthermore, a carbon concentration in the high resistance layer 3 at the side closer to the channel layer 4 is not less than $1.4 \times 10^{19}/cm^3$, desirably not less than $1.9 \times 10^{19}/cm^3$, and not more than $1.0 \times 10^{21}/cm^3$. If the carbon concentration in the high resistance layer 3 at the side closer to the channel layer 4 is more than $1.0 \times 10^{21}/cm^3$, crystallinity would deteriorate, and a side effect, e.g., a decrease of the withstand voltage or an increase of a leak, would start to occur.

Moreover, the carbon concentration in the high resistance layer 3 in the depth direction gradually increases toward the channel layer 4 from the side close to the buffer layer 2. Such a feature is effective in causing carrier compensation due to a lattice mismatch between the superlattice buffer layer and the GaN layer, and in improving reliability.

The channel layer 4 is made of GaN having a small carbon concentration, and it has a layer thickness of 800 nm. The carbon concentration in the channel layer 4 is to be as small as possible and is desirably not more than $1 \times 10^{17}/cm^3$. If the carbon concentration in the channel layer 4 is high, a collapse phenomenon that the on-resistance during a high-voltage operation becomes higher than the on-resistance during a low-voltage operation in the field effect transistor structure would be more likely to occur.

The barrier layer 5 is made of AlGaN with an Al mixed ratio of about 17%, and it has a layer thickness of 34 nm. The barrier layer 5 and the channel layer 4 form a hetero junction. Furthermore, 2DEG (two dimensional electron gas) is formed in a portion of the channel layer 4 at or near the interface between the barrier layer 5 and the channel layer 4, the portion being positioned close to the barrier 5. When the field effect transistor is in an on-state, electrons flows through the 2DEG. On the other hand, when the field effect transistor is in an off-state, electrons do not flow because a depletion layer is generated under the gate electrode 13.

The source electrode 11 and the drain electrode 12 are ohmic-connected to the 2DEG in the channel layer 4. More specifically, grooves 4a and 4b called "recesses" are formed in an upper surface of the channel layer 4, and the grooves 4a and 4b are filled with respective parts of the source electrode 11 and the drain electrode 12. With such a structure, the source electrode 11 and the drain electrode 12 are each contacted with the 2DEG from a horizontal direction.

The first insulating film 20 is formed under the gate electrode 13. In other words, the gate electrode 13 is formed on the barrier layer 5 with the first insulating film 20 interposed therebetween.

In the embodiment, a distance between the gate electrode 13 and the drain electrode 12 is 15 μm, and a distance between the gate electrode 13 and the source electrode 11 is 2 μm. A gate length is 2 μm, and a gate width is about 160 mm. Here, the gate length corresponds to a length of the gate electrode 13 in a right and left direction on the drawing sheet of FIG. 1. The gate width corresponds to a length of the gate electrode 13 in a direction perpendicular to the drawing sheet of FIG. 1.

The first insulating film 20 is made of Si-rich SiN. The first insulating film 20 is formed to be further positioned over a lateral surface of the gate electrode 13 at the side closer to the source electrode 11 and over a lateral surface of the gate electrode 13 at the side closer to the drain electrode 12. In addition, a part of the first insulating film 20 is formed on the second insulating film 21.

The second insulating film 21 is made of SiN as per stoichiometry. The second insulating film 21 is formed in regions other than the regions where the source electrode 11, the drain electrode 12, and the first insulating film 20 are formed. Thus, the second insulating film 21 covers a most part of the upper surface of the barrier layer 5.

Determination whether good or no good on the basis of accelerated tests of the field effect transistor will be described below with reference to FIGS. 2 to 4.

Regarding the field effect transistor described above, a rate of good products is determined as follows. After removing an initial failure, a drain voltage of 650 V is applied to the field effect transistor for 5 minutes under an accelerated condition of 200° C. in an off-state where a source voltage is 0 V, a voltage at a rear surface of the substrate is 0 V, and a gate voltage is Vg=-10 V. Then, a percentage of good products, which have not been broken, is obtained as the rate of good products.

Figure 2:
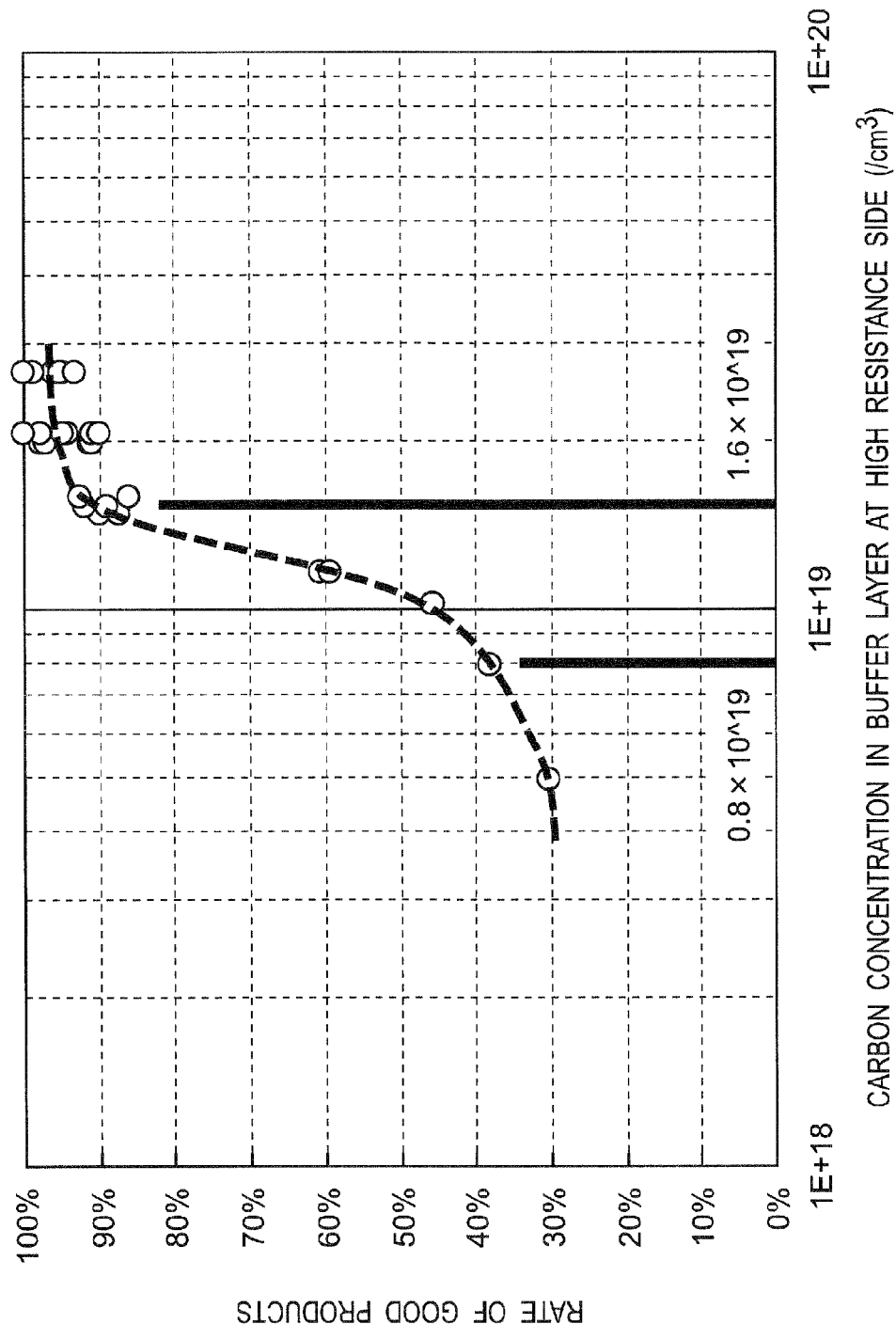
FIG. 2 is a graph related to a carbon concentration in a buffer layer at the side closer to a high resistance layer.

FIG. 2 is a graph depicting a relation between the carbon concentration in the buffer layer 2 at the side closer to the high resistance layer 3 and the rate of good products. Scale markings denoted by 1E+18, 1E+19, and 1E+20 along a horizontal axis of FIG. 2 represent $10^{18}$, $10^{19}$, and $10^{20}$, respectively. Furthermore, in FIG. 2, 0.8×10^19 represents $0.8 \times 10^{19}$ and corresponds to the carbon concentration at an intersection between a thick linear line on the left and the horizontal axis. In FIG. 2, 1.6×10^19 represents $1.6 \times 10^{19}$ and corresponds to the carbon concentration at an intersection between a thick linear line on the right and the horizontal axis.

As seen from FIG. 2, the following has been confirmed from experiments. The rate of good products starts to drastically increase from a point at which the carbon concentration in the buffer layer 2 at the side closer to the high resistance layer 3 reaches and exceeds $0.8 \times 10^{19}/cm^3$. At $1.6 \times 10^{19}/cm^3$ or more, the rate of good products is 90% or more. A high rate of good products is stably obtained at the carbon concentration of not less than $1.6 \times 10^{19}/cm^3$.

During the accelerated test represented by FIG. 2, the carbon concentration in the high resistance layer 3 at the side closer to the buffer layer 2 is not less than $3.7 \times 10^{18}/cm^3$ and not more than $1.0 \times 10^{21}/cm^3$, and the carbon concentration in the high resistance layer 3 at the side closer to the channel layer 4 is not less than $1.4 \times 10^{19}/cm^3$ and not more than $1.0 \times 10^{21}/cm^3$. In the high resistance layer 3 having such a property, the carbon concentration is maximized in its surface at the side close to the channel layer 4. Moreover, in the high resistance layer 3, the carbon concentration gradually increases toward the channel layer 4 from the side close to the buffer layer 2.

Figure 3:
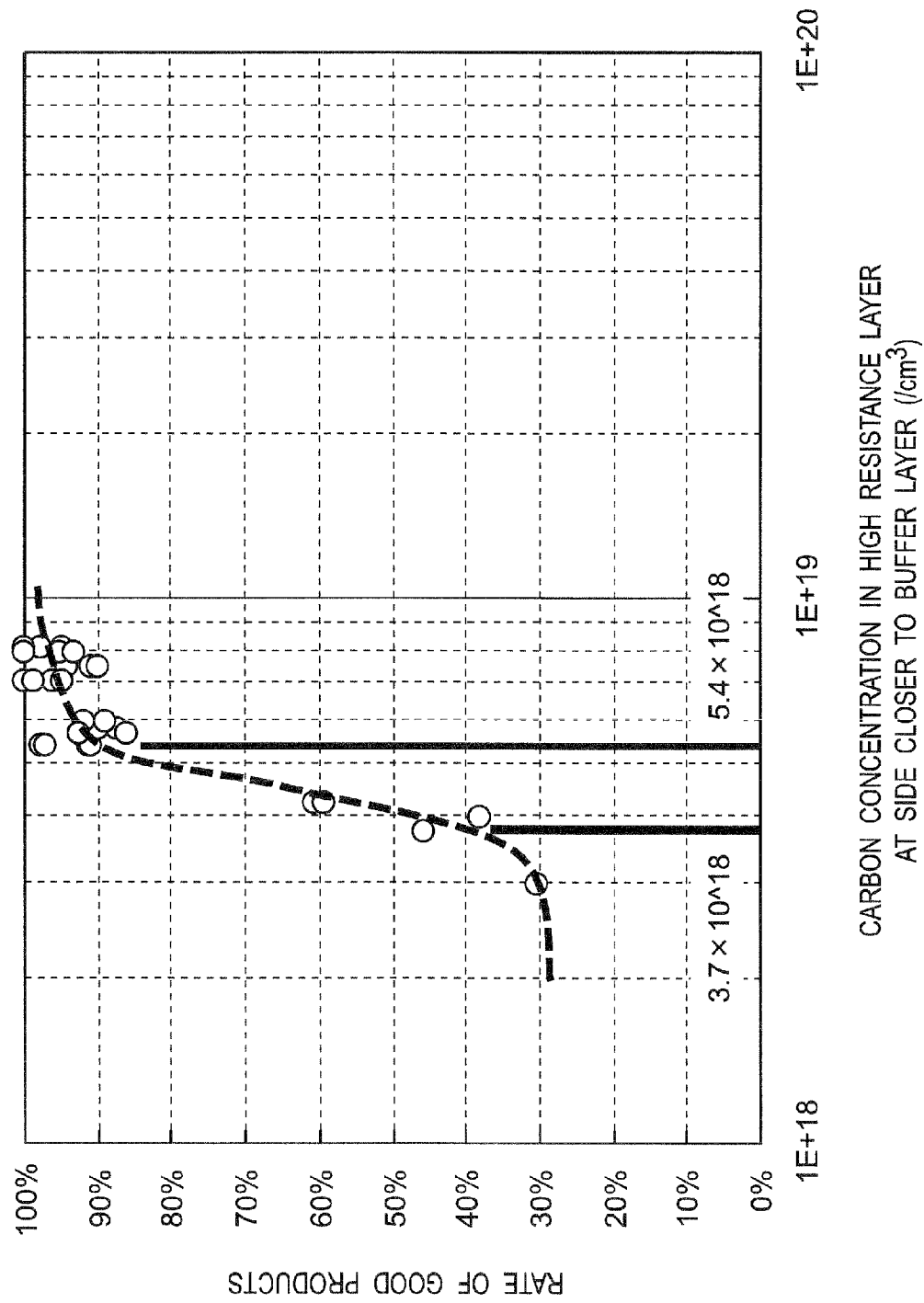
FIG. 3 is a graph related to a carbon concentration in the high resistance layer at the side closer to the buffer layer.

FIG. 3 is a graph depicting a relation between the carbon concentration in the high resistance layer 3 at the side closer to the buffer layer 2 and the rate of good products. Scale markings denoted by 1E+18, 1E+19, and 1E+20 along a horizontal axis of FIG. 3 represent $10^{18}$, $10^{19}$, and $10^{20}$, respectively. Furthermore, in FIG. 3, 3.7×10^18 represents $3.7 \times 10^{18}$ and corresponds to the carbon concentration at an intersection between a thick linear line on the left and the horizontal axis. In FIG. 3, 5.4×10^18 represents $5.4 \times 10^{18}$ and corresponds to the carbon concentration at an intersection between a thick linear line on the right and the horizontal axis.

As seen from FIG. 3, the following has been confirmed from experiments. The rate of good products starts to drastically increase from a point at which the carbon concentration in the high resistance layer 3 at the side closer to the buffer layer 2 reaches and exceeds $3.7 \times 10^{18}/cm^3$. At $5.4 \times 10^{18}/cm^3$ or more, the rate of good products is 90% or more. A high rate of good products is stably obtained at the carbon concentration of not less than $5.4 \times 10^{18}/cm^3$.

During the accelerated test represented by FIG. 3, the carbon concentration in the buffer layer 2 at the side closer to the high resistance layer 3 is set to be not less than $0.8 \times 10^{19}/cm^3$ and not more than $1.0 \times 10^{21}/cm^3$, and the carbon concentration in the high resistance layer 3 at the side closer to the channel layer 4 is set to be not less than $1.4 \times 10^{19}/cm^3$ and not more than $1.0 \times 10^{21}/cm^3$.

Figure 4:
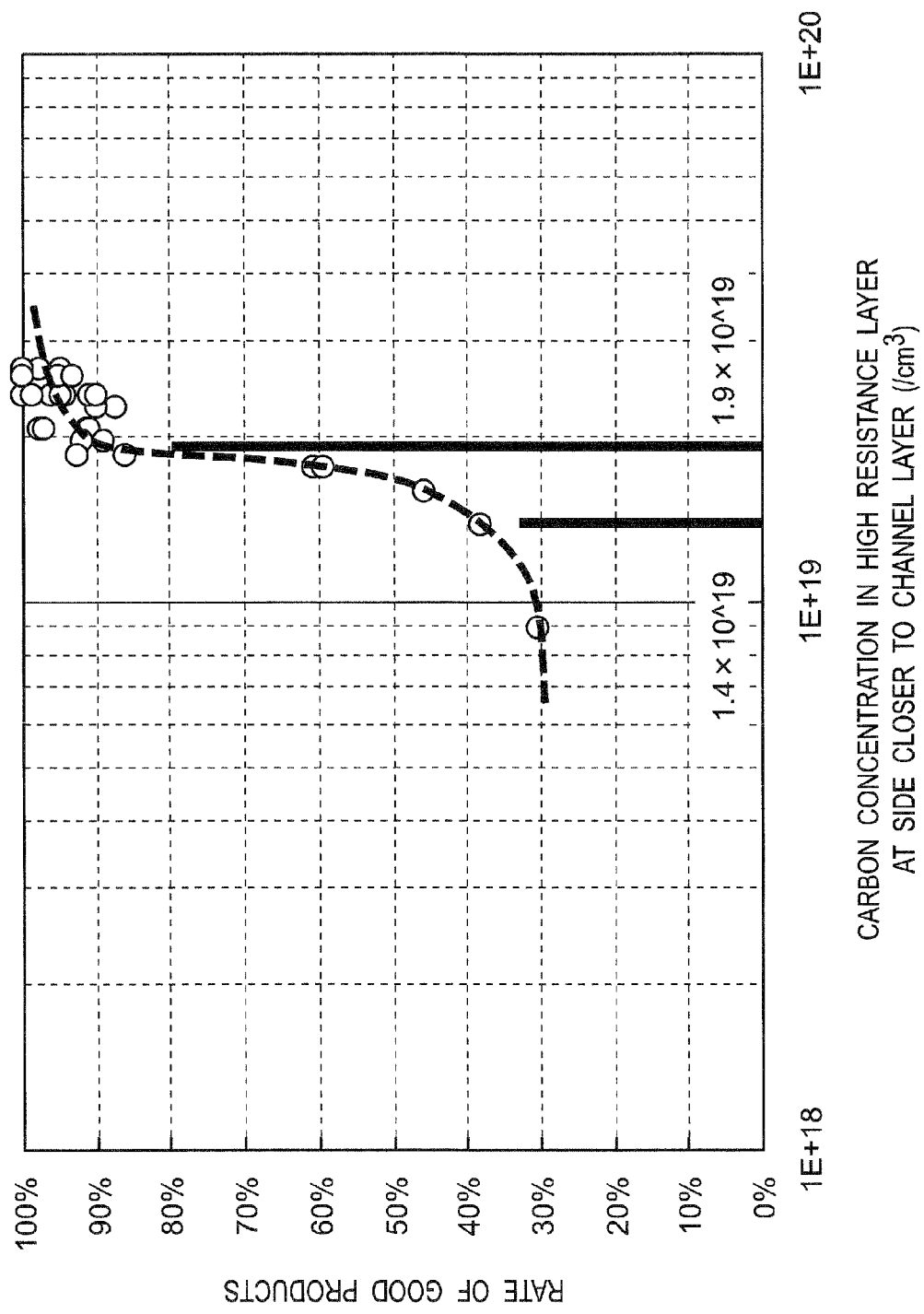
FIG. 4 is a graph related to a carbon concentration in the high resistance layer at the side closer to a channel layer.

FIG. 4 is a graph depicting a relation between the carbon concentration in the high resistance layer 3 at the side closer to the channel layer 4 and the rate of good products. Scale markings denoted by 1E+18, 1E+19, and 1E+20 along a horizontal axis of FIG. 4 represent $10^{18}$, $10^{19}$, and $10^{20}$, respectively. Furthermore, in FIG. 4, 1.4×10^19 represents $1.4 \times 10^{19}$ and corresponds to the carbon concentration at an intersection between a thick linear line on the left and the horizontal axis. In FIG. 4, 1.9×10^19 represents $1.9 \times 10^{19}$ and corresponds to the carbon concentration at an intersection between a thick linear line on the right and the horizontal axis.

As seen from FIG. 4, the following has been confirmed from experiments. The rate of good products starts to drastically increase from a point at which the carbon concentration in the high resistance layer 3 at the side closer to the channel layer 4 reaches and exceeds $1.4 \times 10^{19}/cm^3$. At $1.9 \times 10^{19}/cm^3$ or more, the rate of good products is 90% or more. A high rate of good products is stably obtained at the carbon concentration of not less than $1.9 \times 10^{19}/cm^3$.

During the accelerated test represented by FIG. 4, the carbon concentration in the buffer layer 2 at the side closer to the high resistance layer 3 is set to be not less than $0.8 \times 10^{19}/cm^3$ and not more than $1.0 \times 10^{21}/cm^3$, and the carbon concentration in the high resistance layer 3 at the side closer to the buffer layer 2 is set to be not less than $3.7 \times 10^{18}/cm^3$ and not more than $1.0 \times 10^{21}/cm^3$.

As described above, the lifetime can be drastically prolonged by setting the carbon concentration in the buffer layer 2 at the side closer to the high resistance layer 3 to be not less than $0.8 \times 10^{19}/cm^3$ and not more than $1.0 \times 10^{21}/cm^3$ in comparison with the case of setting the carbon concentration in the buffer layer 2 at the side closer to the high resistance layer 3 to be less than $0.8 \times 10^{19}/cm^3$ or more than $1.0 \times 10^{21}/cm^3$. Accordingly, reliability can be increased sufficiently.

It is to be noted that the above-described results have been obtained by changing the carbon concentration not only in respective ranges indicated along the horizontal axes of FIGS. 2, 3 and 4, but also in ranges other than the indicated ranges of the carbon concentration.

To sum up the above-described results, reliability is drastically improved on condition that the carbon concentration in the buffer layer 2 at the side closer to the high resistance layer 3 is not less than $0.8 \times 10^{19}/cm^3$ and not more than $1.0\times10^{21}$/cm$^3$, that the carbon concentration in the high resistance layer 3 at the side closer to the buffer layer 2 is not less than $3.7\times10^{18}$/cm$^3$ and not more than $1.0\times10^{21}$/cm$^3$, and that the carbon concentration in the high resistance layer 3 at the side closer to the channel layer 4 is not less than $1.4\times10^{19}$/cm$^3$ and not more than $1.0\times10^{21}$/cm$^3$.

Furthermore, very stable high reliability is obtained on condition that the carbon concentration in the buffer layer 2 at the side closer to the high resistance layer 3 is not less than $1.6\times10^{19}$/cm$^3$, that the carbon concentration in the high resistance layer 3 at the side closer to the buffer layer 2 is not less than $5.4\times10^{18}$/cm$^3$, and that the carbon concentration in the high resistance layer 3 at the side closer to the channel layer 4 is not less than $1.9\times10^{19}$/cm$^3$.

In other words, reliability can be improved by changing the carbon concentrations depicted in FIGS. 2 to 4.

The inventors have found that, in the transistor structure, generation of a leak current flowing from the drain electrode toward the rear surface of the substrate results in reduction of reliability.

FIGS. 5 to 8 are each a graph depicting a relation between a leak current and a drain voltage in a transistor when measured in an environment of 150° C. The transistor is a field effect transistor having the same configuration as that of the field effect transistor illustrated in FIG. 1.

The leak currents depicted in FIGS. 5 to 8 are each measured under conditions that the gate voltage is set to −10 V, and the source voltage and the voltage at the rear surface of the substrate are both set to 0 V. Moreover, in FIGS. 5 to 8, the leak current flowing in the drain electrode is denoted by Id, the leak current flowing in the gate electrode is denoted by Ig, and the leak current flowing in the rear surface of the substrate is denoted by Isub.

Figure 5:
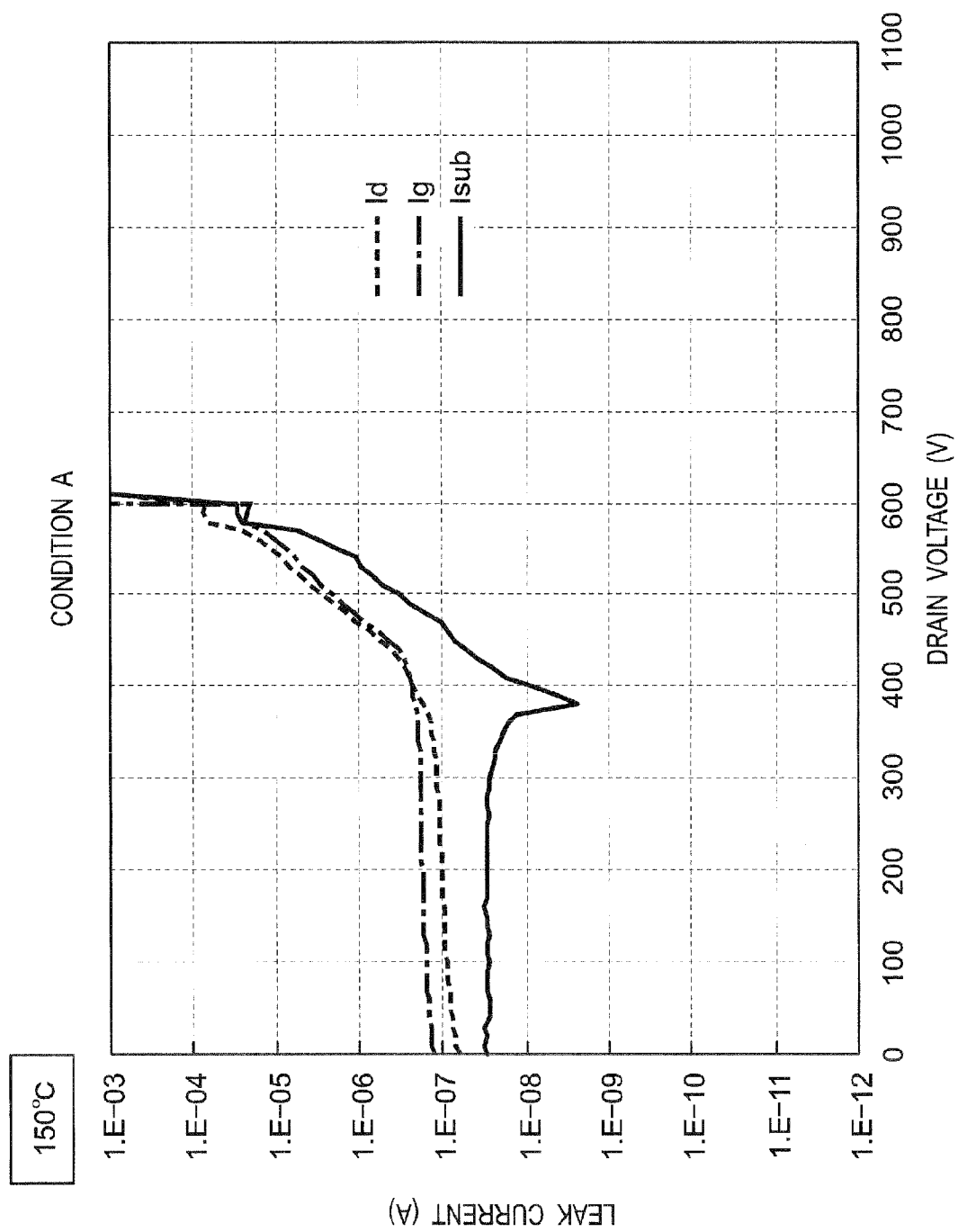
FIG. 5 is a graph depicting a relation between a leak current and a drain voltage in a transistor under a condition A.
Figure 6:
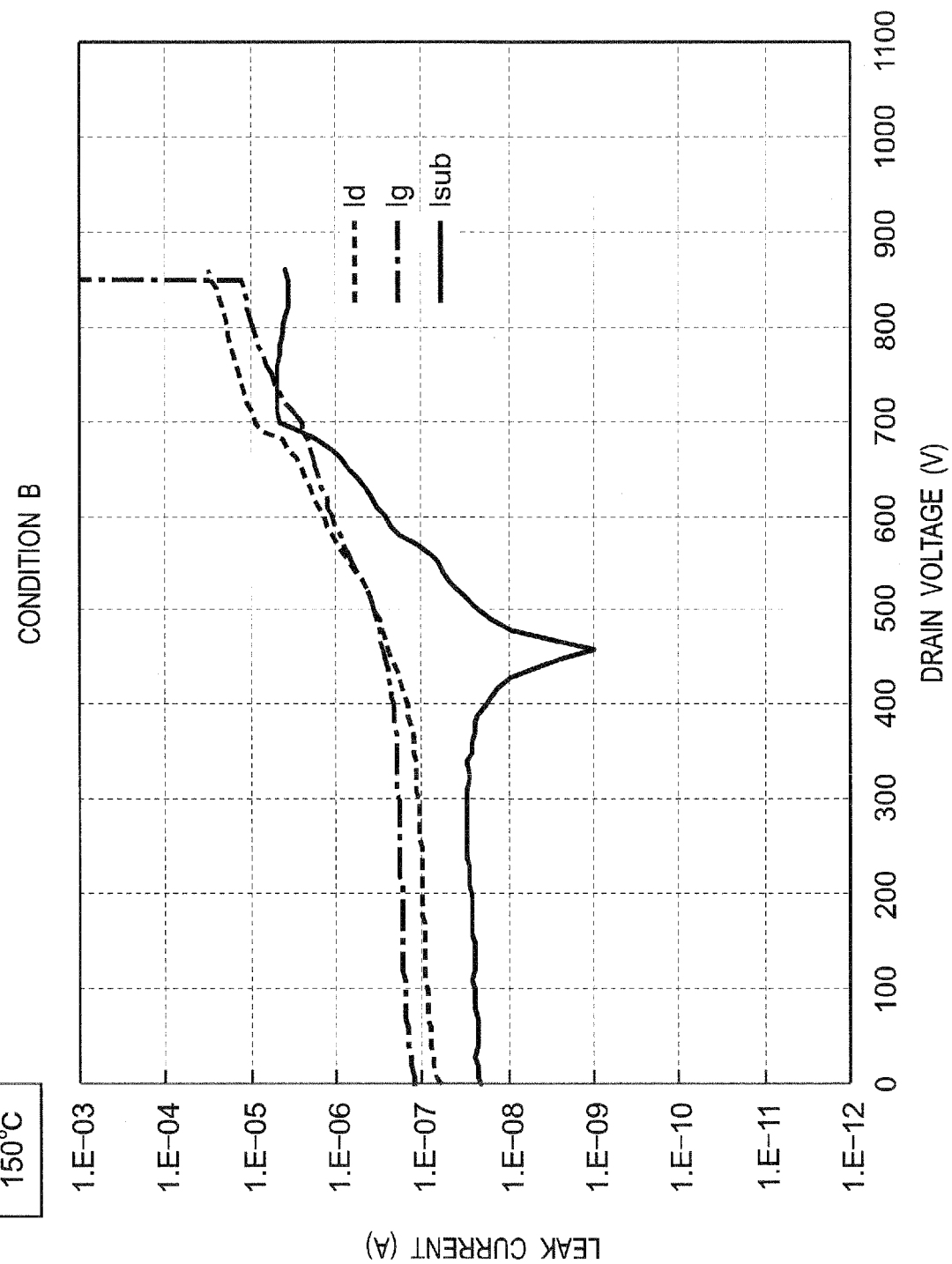
FIG. 6 is a graph depicting a relation between a leak current and a drain voltage in the transistor under a condition B.
Figure 7:
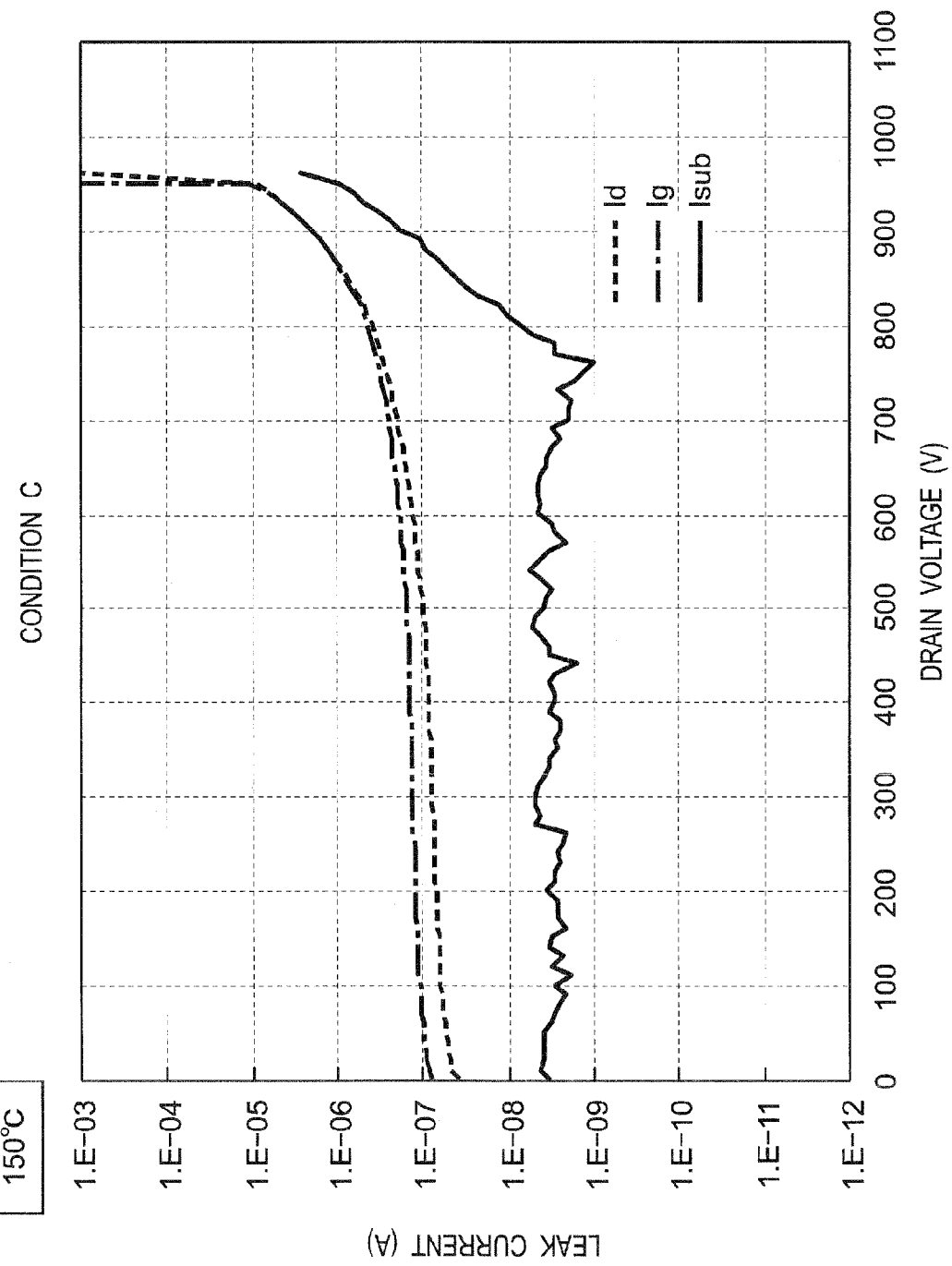
FIG. 7 is a graph depicting a relation between a leak current and a drain voltage in the transistor under a condition C.
Figure 8:
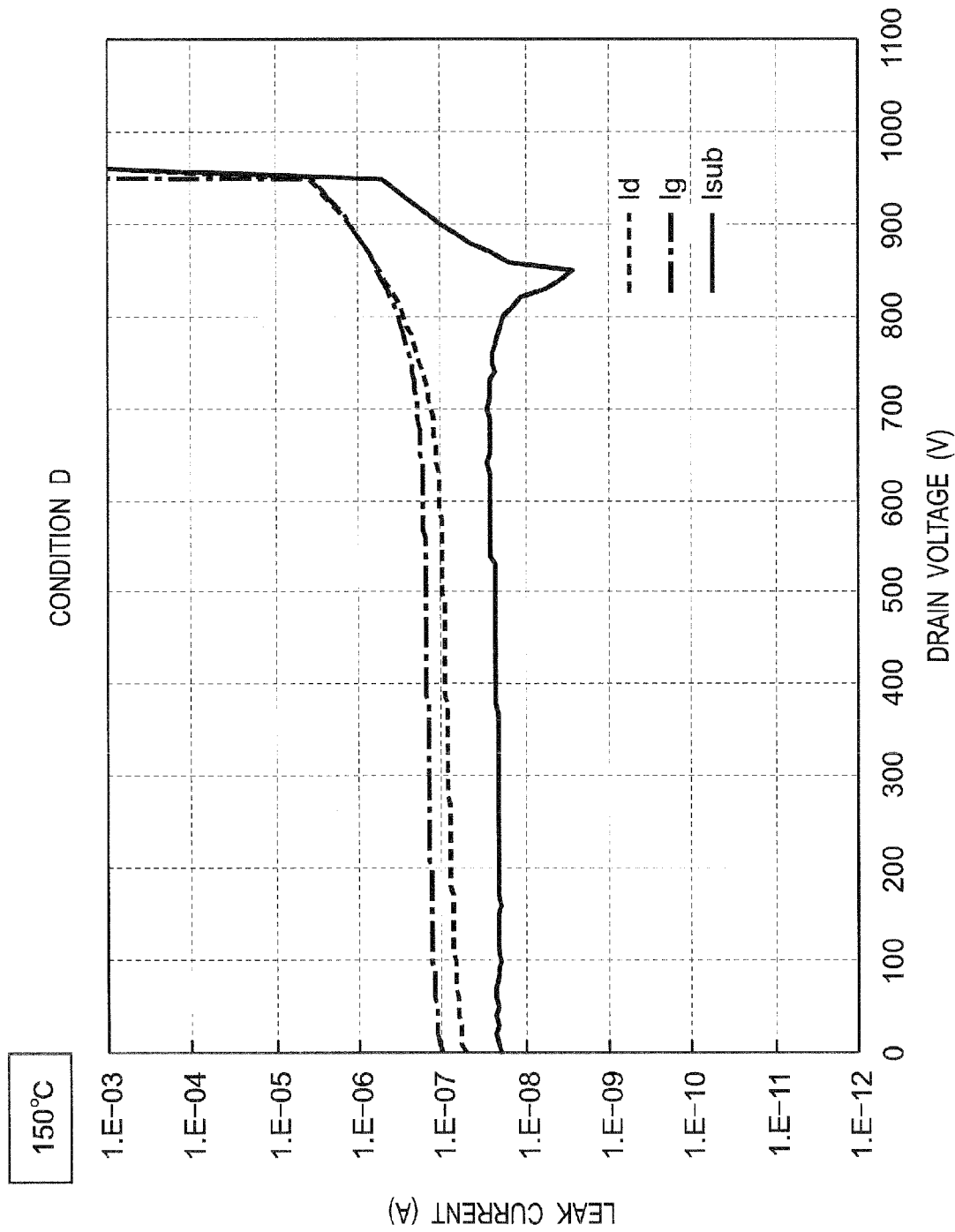
FIG. 8 is a graph depicting a relation between a leak current and a drain voltage in the transistor under a condition D.

Furthermore, in FIGS. 5 to 8, a vertical axis is graduated in log scale, and the leak current is indicated as an absolute value. In FIG. 5, for example, when the drain voltage is from 0 V to 380 V, Isub flows in a direction toward the drain electrode from the rear surface of the substrate. However, when the drain voltage reaches 380 V, the direction of Isub is changed over. After the drain voltage exceeds 380 V, Isub flows in a direction toward the rear surface of the substrate from the drain electrode. The drain voltage at which the flowing direction of Isub is reversed (i.e., the Isub reverse voltage) is 460 V in FIG. 6, 760 V in FIG. 7, and 850 V in FIG. 8.

Conditions A to D set in the cases of FIGS. 5 to 8 are as per indicated in Table given below.

to the buffer layer, the carbon concentration in the high resistance layer at the side closer to the channel layer, and the carbon concentration in the buffer layer at the side closer to the high resistance layer are independent and are not correlated with one another, the Isub reverse voltages tend to increase in any regions of the carbon concentrations along the horizontal axes at a higher carbon concentration.

The above-mentioned phenomenon of the reverse in the flowing direction of Isub is presumably generated upon riding-over beyond a potential barrier that is assumed to be formed by the high resistance layer and the buffer layer. Such a potential barrier rises as the carbon concentration increases. The cause is thought as residing in an increase of resistance attributable to an increase in amount of doped carbon, or an increase in breakdown field strength attributable to an increase in amount of doped carbon. However, an exact mechanism why the potential barrier rises with an increase in the carbon concentration is not yet clarified.

Figure 9A:
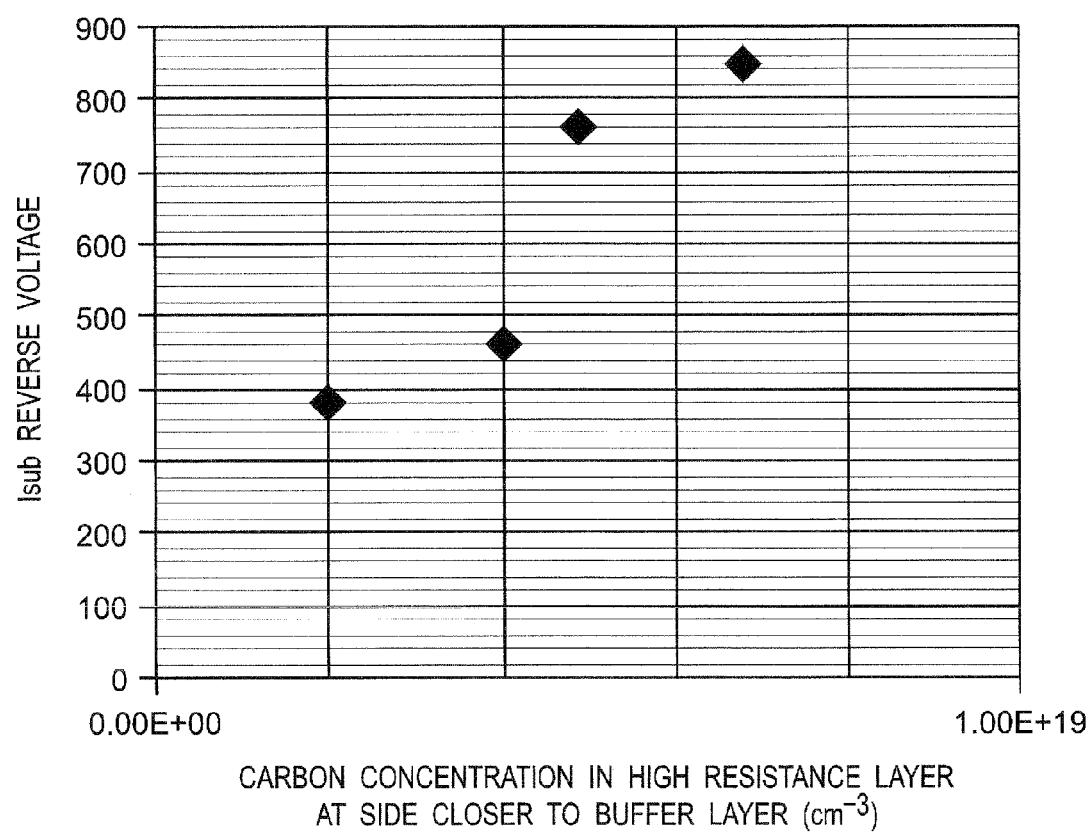
FIG. 9A is a graph depicting a relation between a carbon concentration in the high resistance layer at the side closer to the buffer layer and an Isub reverse voltage.
Figure 9B:
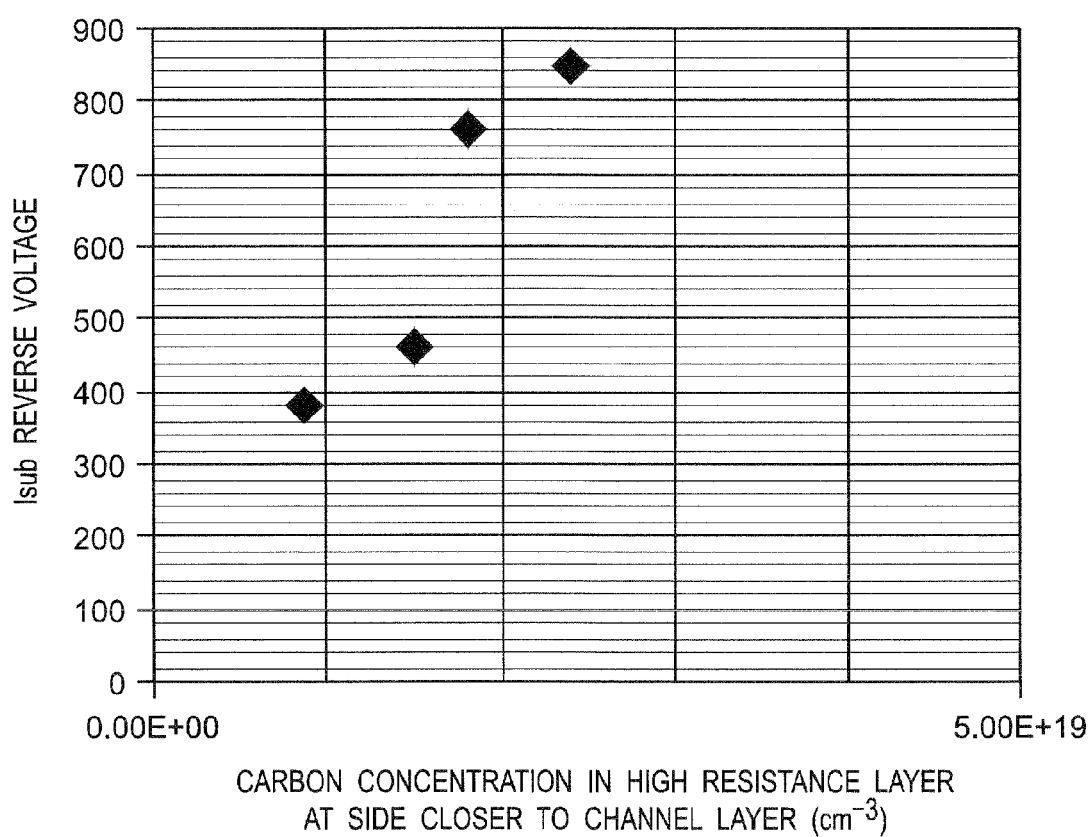
FIG. 9B is a graph depicting a relation between the carbon concentration in the high resistance layer at the side closer to the channel layer and an Isub reverse voltage.
Figure 9C:
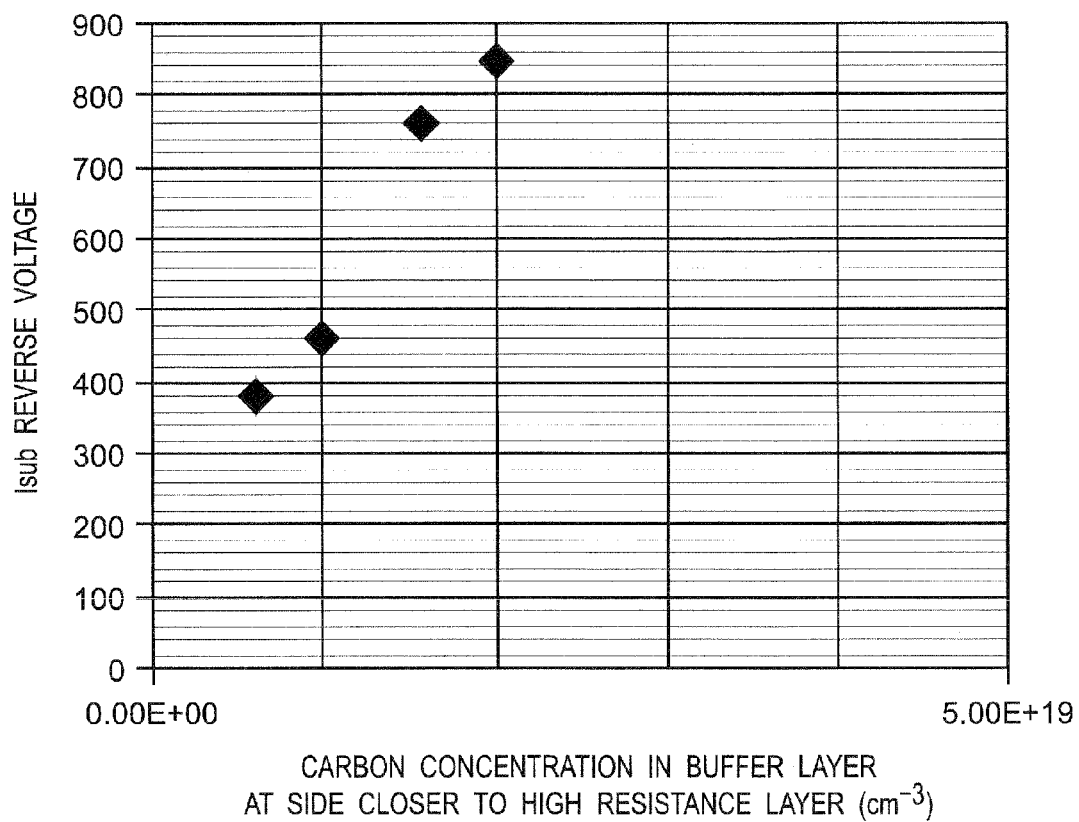
FIG. 9C is a graph depicting a relation between a carbon concentration in the buffer layer at the side closer to the high resistance layer and an Isub reverse voltage.

Anyway, from a series of the results illustrated in FIGS. 9A to 9C, it has been found that because the Isub reverse voltage increases at a higher carbon concentration, Isub flowing from the rear surface of the substrate toward the drain electrode is suppressed, and that reliability is improved consequently.

Thus, the following point has been confirmed from the relations between the Isub reverse voltages and the carbon concentrations in the relevant layers, illustrated in FIGS. 9A to 9C. When the carbon concentration in the buffer layer at the side closer to the high resistance layer is not less than $1.2\times10^{19}$/cm$^3$, the carbon concentration in the high resistance layer at the side closer to the buffer layer is not less than $4.4\times10^{18}$/cm$^3$, and the carbon concentration in the high resistance layer at the side closer to the channel layer is not less than $1.6\times10^{19}$/cm$^3$, the Isub reverse voltage is increased, and hence reliability can be improved.

While, in the embodiment described above, the substrate 1 is a silicon substrate, it may be, instead of the silicon substrate, another type of substrate on which a nitride semiconductor can be laminated. For example, a sapphire substrate, a GaN substrate, a SiC substrate, or an AlN substrate may be used in the embodiment.

While, in the embodiment described above, the buffer layer 2 is made of AlN and $Al_xGa_{1-x}N$, the buffer layer 2 may be made of, instead of AlN and $Al_xGa_{1-x}N$, one or more materials insofar as the materials satisfy the withstand voltage required for the nitride semiconductor.

|  | Carbon concentration in high resistance layer at side closer to buffer layer (cm$^{-3}$) | Carbon concentration in high resistance layer at side closer to channel layer (cm$^{-3}$) | Carbon concentration in buffer layer at side closer to high resistance layer (cm$^{-3}$) | Isub reverse voltage (V) |
|---|---|---|---|---|
| Condition A | $2.0 \times 10^{18}$ | $0.9 \times 10^{19}$ | $0.6 \times 10^{19}$ | 380 |
| Condition B | $4.0 \times 10^{18}$ | $1.5 \times 10^{19}$ | $1.0 \times 10^{19}$ | 460 |
| Condition C | $4.9 \times 10^{18}$ | $1.8 \times 10^{19}$ | $1.57 \times 10^{19}$ | 760 |
| Condition D | $6.8 \times 10^{18}$ | $2.4 \times 10^{19}$ | $2.0 \times 10^{19}$ | 850 |

FIGS. 9A to 9C are each a graph depicting a relation between the carbon concentration and the Isub reverse voltage. It is to be noted that the Isub reverse voltages in FIGS. 9A to 9C have been measured by changing the carbon concentration not only in respective ranges indicated along horizontal axes, but also in ranges other than the indicated ranges of the carbon concentration.

As seen from FIGS. 9A to 9C, although the carbon concentration in the high resistance layer at the side closer While, in the embodiment described above, the Al composition x of $Al_xGa_{1-x}N$ in the buffer layer 2 is constant in the depth direction, it may be gradually changed in the depth direction. Stated in another way, a composition gradient layer containing $Al_xGa_{1-x}N$ with the Al composition x of $Al_xGa_{1-x}N$ being gradually changed in the depth direction may be used as another example of the buffer layer in the above embodiment.

In the embodiment described above, the buffer layer 2 may be replaced with a buffer layer having a multilayer structure in which a single layer or plural layers of $Al_xGa_{1-x}N$ and a single layer or plural layers of $Al_yGa_{1-y}N$ ($0 \le x < 1$, $0 \le y < 1$, and $x \ne y$) are laminated.

In the embodiment described above, the buffer layer 2 may be replaced with a buffer layer in combination of the above-mentioned composition gradient layer and the above-mentioned multilayer structure.

In the embodiment described above, an underlying layer to promote crystal growth may be disposed between the buffer layer 2 and the substrate 1. The underlying layer is made of AlN or GaN, for example.

While, in the embodiment described above, the second insulating film 21 covers the almost entire region of the upper surface of the barrier layer 5 where the barrier layer 5 is not covered with the source electrode and the drain electrode, the second insulating film 21 may cover a part or the whole of the relevant region.

In the embodiment described above, from the viewpoint of prolonging the lifetime, the carbon concentration in the high resistance layer 3 at the side closer to the buffer layer 2 is preferably not less than $3.7 \times 10^{18}/cm^3$, desirably not less than $5.4 \times 10^{18}/cm^3$, and not more than $1.0 \times 10^{21}/cm^3$ over the entire region of the high resistance layer 3 in the depth direction.

While, in the embodiment described above, the source electrode 11 and the drain electrode 12 are partly buried in the grooves 4a and 4b, respectively, the entireties of those electrodes may be not buried in the grooves 4a and 4b.

While, in the embodiment described above, the Al mixed ratio in the barrier layer 5 is about 17%, it may be set to a value other than about 17% insofar as 2DEG (two dimensional electron gas) is generated in a portion of the channel layer 4 at or near the interface between the barrier layer 5 and the channel layer 4.

In the embodiment described above, as one example of a spacer layer for increasing the mobility in the 2DEG, AlN may be formed between the barrier layer 5 and the channel layer 4.

In the embodiment described above, a GaN layer may be formed as one example of a cap layer on the barrier layer 5. The cap layer is effective in preventing oxidation of Al in AlGaN in the barrier layer 5, preventing intrusion of impurities, and preventing distortion of the barrier layer, which is caused due to a difference in the lattice constant, by sandwiching the barrier layer 5 made of AlGaN with the two GaN layers from both the sides.

While, in the embodiment described above, the source electrode 11 and the drain electrode 12 are ohmic-connected to the 2DEG by forming the recesses where those electrodes are disposed, the recesses are not always required to be used insofar as those electrodes are ohmic-connected to the 2DEG. In the case not using the recesses, the source electrode 11 and the drain electrode 12 may be conducted to the 2DEG, for example, by injecting ions into respective regions of the channel layer 4 positioned under the source electrode 11 and the drain electrode 12. Alternatively, the source electrode 11 and the drain electrode 12 may be conducted to the 2DEG by performing high-temperature annealing such that the metals of the source electrode 11 and the drain electrode 12 are permeated into the respective regions of the channel layer 4 positioned under the source electrode 11 and the drain electrode 12.

While, in the embodiment described above, the gate electrode 13 is formed on the barrier layer 5 with the first insulating film 20 interposed between them, the gate electrode 13 may be formed directly on the barrier layer 5. In other words, the gate electrode 13 may be formed directly on the surface of the nitride semiconductor insofar as the gate 13 is operable to turn on/off the field effect transistor.

While, in the embodiment described above, the first insulating film 20 is made of Si-rich SiN, the first insulating film 20 may be made of, instead of Si-rich SiN, another material insofar as the material can reduce a leak between the gate electrode 13 and the nitride semiconductor.

While, in the embodiment described above, the second insulating film 21 is made of SiN as per stoichiometry, the second insulating film 21 may be made of a different material (e.g., $SiO_2$) other than SiN insofar as the material can ensure insulation between the gate electrode 13 and the source electrode 11, insulation between the gate electrode 13 and the drain electrode 12, and insulation between the source electrode 11 and the drain electrode 12.

While, in the embodiment described above, the second insulating film 21 is made of SiN formed as per stoichiometry on the barrier layer 5, the second insulating film 21 may be made of a Si-rich SiN film formed on the barrier layer 5, and of an insulating film made of a material other than SiN and formed on the SiN film. In other words, the second insulating film 21 having a single-layer structure may be replaced with a second insulating film having a multilayer structure.

While, in the embodiment described above, the distance between the gate electrode 13 and the drain electrode 12 is set to 15 μm, the relevant distance may be set to be shorter than 15 μm or longer than 15 μm insofar as the distance is within a range capable of maintaining the withstand voltage between the gate and the drain, and insofar as a leak is not increased excessively. When the distance between the gate electrode 13 and the drain electrode 12 is set to a value other than 15 μm as mentioned above, the relevant distance is desirably set to, e.g., 5 μm or more.

While, in the embodiment described above, the distance between the gate electrode 13 and the source electrode 11 is set to 2 μm, the relevant distance may be set shorter than 2 μm or longer than 2 μm insofar as the distance is within a range capable of maintaining the withstand voltage between the gate and the source, and insofar as a leak is not increased excessively. When the distance between the gate electrode 13 and the drain electrode 12 is set to a value other than 2 μm as mentioned above, the relevant distance is desirably set to, e.g., 0.1 μm or more.

While, in the embodiment described above, the gate length is set to 2 μm, the gate length may be set to be shorter than 2 μm or longer than 2 μm insofar as a leak is not increased excessively due to a short channel effect. When the gate length is set to a value other than 2 μm as mentioned above, the gate length is desirably set to, e.g., 0.5 μm or more.

While, in the embodiment described above, the gate width is set to about 160 mm, the value of about 160 mm is set to obtain the desired on-resistance. Accordingly, the gate width may be set to be longer than 160 mm or shorter than 160 mm. Thus, the gate width can be set optionally.

While the practical embodiment of the present invention has been described above, the present invention is not limited to the above-described embodiment, and the present invention can be implemented in various modified forms within the scope of the invention. For example, proper combinations of the above-described modifications may be practiced as embodiments of the present invention.

The present invention and the embodiment can be recapitulated as follows.

A field effect transistor of the present invention includes:
a substrate 1;
a buffer layer 2 laminated on the substrate 1;
a high resistance layer 3 laminated on the buffer layer 2;
a channel layer 4 laminated on the high resistance layer 3;
a nitride semiconductor layer 5 laminated on the channel layer 4 and serving as a barrier layer;
a source electrode 11 and a drain electrode 12 disposed on the nitride semiconductor layer 5 at positions spaced from each other; and
a gate electrode 13 formed between the source electrode 11 and the drain electrode 12 and on the nitride semiconductor layer 5, the gate electrode being connected to the nitride semiconductor layer 5 directly or with an insulating film 20 interposed therebetween,
wherein a carbon concentration in the buffer layer 2 at the side closer to the high resistance layer 3 is not less than $0.8 \times 10^{19}/cm^3$ and not more than $1.0 \times 10^{21}/cm^3$,
a carbon concentration in the high resistance layer 3 at the side closer to the buffer layer 2 is not less than $3.7 \times 10^{18}/cm^3$ and not more than $1.0 \times 10^{21}/cm^3$, and
a carbon concentration in the high resistance layer 3 at the side closer to the channel layer 4 is not less than $1.4 \times 10^{19}/cm^3$ and not more than $1.0 \times 10^{21}/cm^3$.

Here, the nitride semiconductor layer 5 may be expressed by $Al_xIn_yGa_{1-x-y}N$ ($x \geq 0$, $y \geq 0$, and $0 \leq x+y \leq 1$).

With the features described above, a lifetime can be prolonged drastically. Hence reliability can be increased sufficiently.

In the field effect transistor according to an embodiment,
the carbon concentration in the buffer layer 2 at the side closer to the high resistance layer 3 is not less than $1.2 \times 10^{19}/cm^3$,
the carbon concentration in the high resistance layer 3 at the side closer to the buffer layer 2 is not less than $4.4 \times 10^{18}/cm^3$, and
the carbon concentration in the high resistance layer 3 at the side closer to the channel layer 4 is not less than $1.6 \times 10^{19}/cm^3$.

With the features described above, since the Isub reverse voltage can be increased, the lifetime can be further prolonged, and higher reliability can be obtained.

In the field effect transistor according to an embodiment,
the carbon concentration in the buffer layer 2 at the side closer to the high resistance layer 3 is not less than $1.6 \times 10^{19}/cm^3$,
the carbon concentration in the high resistance layer 3 at the side closer to the buffer layer 2 is not less than $5.4 \times 10^{18}/cm^3$, and
the carbon concentration in the high resistance layer 3 at the side closer to the channel layer 4 is not less than $1.9 \times 10^{19}/cm^3$.

With the features described above, the lifetime can be reliably prolonged to a large extent.

In the field effect transistor according to an embodiment,
the carbon concentration in the high resistance layer 3 gradually increases toward the channel layer 4 from the side close to the buffer layer 2.

With the embodiment described above, since the carbon concentration in the high resistance layer 3 gradually increases toward the channel layer 4 from the side close to the buffer layer 2, a carrier compensation effect is obtained which is caused due to a lattice mismatch between the superlattice buffer layer 2 and the GaN layer. Hence the reliability can be increased.

REFERENCE SIGNS LIST 1 substrate
2 buffer layer
3 high resistance layer
4 channel layer
5 barrier layer
11 source electrode
12 drain electrode
13 gate electrode
20 first insulating film
21 second insulating film

The invention claimed is:
1. A field effect transistor comprising:
a substrate;
a buffer layer laminated on the substrate and having a multilayer structure formed by $Al_xGa_{1-x}N$ and $Al_yGa_{1-y}N$ ($0 \leq x < 1$, $0 \leq y < 1$, and $x \neq y$);
a high resistance layer laminated on the buffer layer and made of GaN containing carbon;
a channel layer laminated on the high resistance layer;
a nitride semiconductor layer laminated on the channel layer and serving as a barrier layer;
a source electrode and a drain electrode disposed on the nitride semiconductor layer in an arrangement spaced from each other; and
a gate electrode formed between the source electrode and the drain electrode and on the nitride semiconductor layer, the gate electrode being connected to the nitride semiconductor layer directly or with an insulating film interposed therebetween,
wherein a carbon concentration in the buffer layer at side closer to the high resistance layer is not less than $0.8 \times 10^{19}/cm^3$ and not more than $1.0 \times 10^{21}/cm^3$,
a carbon concentration in the high resistance layer at side closer to the buffer layer is not less than $3.7 \times 10^{18}/cm^3$ and not more than $1.0 \times 10^{21}/cm^3$, and
a carbon concentration in the high resistance layer at side closer to the channel layer is not less than $1.4 \times 10^{19}/cm^3$ and not more than $1.0 \times 10^{21}/cm^3$, and
the carbon concentration in the high resistance layer gradually increases toward the channel layer from side close to the buffer layer.

2. The field effect transistor according to claim 1,
wherein the carbon concentration in the buffer layer at the side closer to the high resistance layer is not less than $1.2 \times 10^{19}/cm^3$,
the carbon concentration in the high resistance layer at the side closer to the buffer layer is not less than $4.4 \times 10^{18}/cm^3$, and
the carbon concentration in the high resistance layer at the side closer to the channel layer is not less than $1.6 \times 10^{19}/cm^3$.

3. The field effect transistor according to claim 1,
wherein the carbon concentration in the buffer layer at the side closer to the high resistance layer is not less than $1.6 \times 10^{19}/cm^3$,
the carbon concentration in the high resistance layer at the side closer to the buffer layer is not less than $5.4 \times 10^{18}/cm^3$, and
the carbon concentration in the high resistance layer at the side closer to the channel layer is not less than $1.9 \times 10^{19}/cm^3$.

4. The field effect transistor according to claim 2,
wherein the carbon concentration in the buffer layer at the side closer to the high resistance layer is not less than $1.6 \times 10^{19}/cm^3$, the carbon concentration in the high resistance layer at the side closer to the buffer layer is not less than $5.4 \times 10^{18}/cm^3$, and the carbon concentration in the high resistance layer at the side closer to the channel layer is not less than $1.9 \times 10^{19}/cm^3$.

* * * * *